(12) United States Patent
Masuduzzaman et al.

(10) Patent No.: US 12,327,046 B2
(45) Date of Patent: Jun. 10, 2025

(54) DATA RETENTION-SPECIFIC REFRESH READ

(71) Applicant: Western Digital Technologies, Inc., San Jose, CA (US)

(72) Inventors: Muhammad Masuduzzaman, Chandler, AZ (US); Deepanshu Dutta, Fremont, CA (US); Abhijith Prakash, Milpitas, CA (US)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 15 days.

(21) Appl. No.: 17/358,576

(22) Filed: Jun. 25, 2021

(65) Prior Publication Data

US 2022/0413761 A1 Dec. 29, 2022

(51) Int. Cl.
*G06F 3/06* (2006.01)
(52) U.S. Cl.
CPC .......... *G06F 3/0659* (2013.01); *G06F 3/0619* (2013.01); *G06F 3/064* (2013.01); *G06F 3/0653* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 8,687,421 B2 | 4/2014 | Avila et al. | |
| 8,966,343 B2 | 2/2015 | Syu et al. | |
| 9,627,055 B1 * | 4/2017 | Robustelli | G06F 13/1657 |
| 9,824,767 B1 * | 11/2017 | Mantegazza | G11C 16/10 |
| 9,881,682 B1 | 1/2018 | Tang et al. | |
| 10,185,609 B2 | 1/2019 | Lin | |
| 10,199,115 B2 | 2/2019 | Shin et al. | |
| 2009/0043954 A1 * | 2/2009 | Tachibana | G06F 13/1636 |
| | | | 711/E12.083 |
| 2014/0146605 A1 * | 5/2014 | Yang | G11C 11/5642 |
| | | | 365/185.03 |
| 2016/0098216 A1 * | 4/2016 | Huang | G06F 11/073 |
| | | | 714/37 |
| 2018/0190350 A1 * | 7/2018 | Connor | G11C 16/3418 |
| 2018/0373438 A1 * | 12/2018 | Bennett | G06F 3/0652 |
| 2019/0034114 A1 | 1/2019 | Natarajan et al. | |
| 2019/0294367 A1 * | 9/2019 | Takada | G11C 16/3418 |
| 2019/0332323 A1 * | 10/2019 | Choi | G06F 3/0656 |
| 2020/0135264 A1 * | 4/2020 | Brady | G06F 3/0679 |

* cited by examiner

*Primary Examiner* — Yaima Rigol
*Assistant Examiner* — Alexander J Yoon
(74) *Attorney, Agent, or Firm* — ARENTFOX SCHIFF LLP

(57) ABSTRACT

A storage device is provided that conditionally performs read refresh in blocks having higher P/E cycles or older programming times, while refraining from performing read refreshes in blocks having lower P/E cycles or recent programming times. The storage device includes a memory and a controller. The memory includes a block having cells. The controller performs a read refresh on the cells when a number of P/E cycles of the block exceeds an age threshold or after a threshold amount time has elapsed since data was programmed in the block. The controller may also refrain from performing read refreshes on the cells until the number of P/E cycles exceeds the age threshold or until a threshold amount of time has elapsed since the data is programmed. As a result, lower BER may occur due to wider Vt margins, while power and system overhead may be saved.

20 Claims, 18 Drawing Sheets

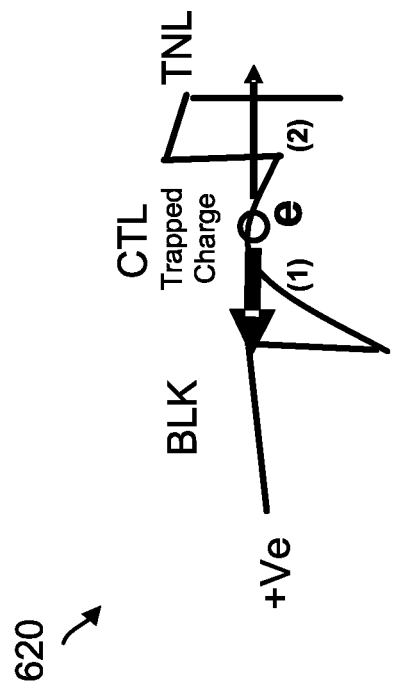
FIG. 6A
FIG. 6B
FIG. 6C

DATA RETENTION-SPECIFIC REFRESH READ

BACKGROUND

Field

This disclosure is generally related to electronic devices and more particularly to storage devices.

Introduction

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

Flash storage devices may program and read data in cells of a block of flash memory. However, between the times that a cell is programmed and read, electric charge stored in the cell may be lost. For example, electrons within a charge trapping layer (CTL) of the cell may migrate through a blocking oxide layer (BLK) or a tunnel oxide layer (TNL) of the cell, leading to cell charge loss. This charge loss may in turn result in bit errors when the flash storage device later attempts to read the cell, thereby impacting the data retention (DR) of the cell or block.

SUMMARY

One aspect of a storage device is disclosed herein. The storage device includes a memory and a controller. The memory includes a block, and the block includes a plurality of cells. The controller is configured to perform a read refresh on the cells in response to a number of program/erase cycles (P/E) cycles of the block exceeding an age threshold.

Another aspect of a storage device is disclosed herein. The storage device includes a memory and a controller. The memory includes a block, and the block includes a plurality of cells. The controller is configured to program the block, and to apply dummy read pulses to the cells after a threshold amount of time has elapsed since the block is programmed.

A further aspect of a storage device is disclosed herein. The storage device includes a memory and a controller. The memory includes a block, and the block includes a plurality of cells. The controller is configured to program data in the block, and to refrain from performing read refreshes on the cells until a number of PIE cycles of the block exceeds an age threshold and until a threshold amount of time has elapsed since the data is programmed in the block.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein:

FIGS. 6A-6C are conceptual diagrams illustrating examples of charge loss in a cell in a neutral state, with an applied positive bias, and with an applied negative bias, respectively.

DETAILED DESCRIPTION

Figure 1:
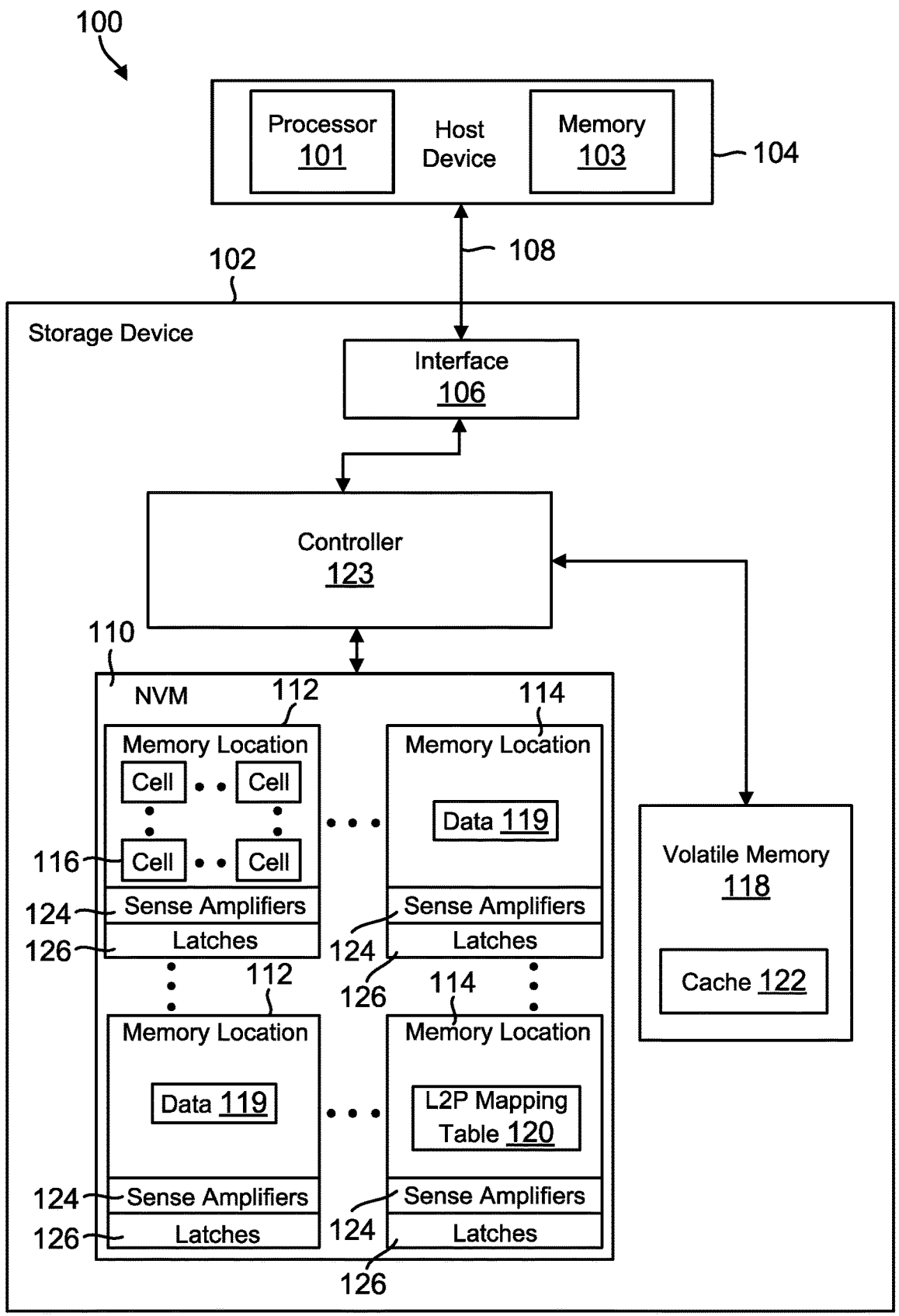
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Flash storage devices may experience charge loss in cells and reduced DR. For example, electrons in the CTL of a cell may migrate through either the BLK or the TNL of the cell, thus reducing the voltage threshold (Vt) of the cell and in turn leading to read errors. Generally, cells with median Vts across a Vt distribution for a given program state (referred to here as median or majority cells), as well as cells with Vts at the upper tail end of the Vt distribution (referred to here as upper tail cells) experience charge loss through the BLK. As a result, if a positive bias or voltage is applied to a gate of a median or upper tail cell, the rate of charge loss may increase, leading to more Vt loss and reduced DR for that cell. In contrast, cells with Vts at the lower tail end of the Vt distribution (referred to here as lower tail cells) experience charge loss through the TNL, which is opposite in direction to the BLK. As a result, if a positive bias is applied to a gate of a lower tail cell, the rate of charge loss may decrease, leading to less Vt loss and increased or maintained DR for that cell. Therefore, when a positive bias is applied to lower tail, median, and upper tail cells of a block at the same time (e.g., on a same word line), the Vt distribution of the cells sharing a given program state may narrow or tighten due to the difference in Vt changes between the cells. Similarly, other Vt distributions for other program states may also narrow, resulting in larger or increased Vt margins between different program states. For instance, applying a 4 V bias to cells on a word line may result in an increased Vt margin of approximately 400 mV (or in other words, Vt distributions in adjacent program states may be separated by an additional 400 mV). As a result of the increased margin, less or no Vt overlap between program states may result, resulting in fewer bit errors.

Refresh read (interchangeably referred to here as read refresh) is a procedure that the flash storage device may perform in order to reduce read errors. In refresh read, the flash storage device periodically applies dummy read pulses to a word line to maintain a positive creep up bias at the gates of the cells coupled to the word line. "Dummy" read pulses here refers to voltage pulses which the controller applies to periodically re-charge the cells in advance of a read; thus, no data may be read in response to these dummy read pulses. The read refresh procedure, which involves application of voltage pulses without incurring a P/E cycle, is different from a data refresh or data scrubbing procedure, which refreshes data by erasing data from an old block and programming the data into a new block. Thus, read refresh may allow for verify and read conditions to be matched without incurring P/E cycles. For instance, during refresh read, the controller may periodically apply dummy read pulses to a cell in order to refresh the charge of the cell between execution of host read commands, thus maintaining the Vt of the cell to comply with program verify and read voltage checks and significantly reduce bit error rate (BER).

In addition to minimizing verify and read voltage mismatches, refresh read may improve the DR of the cells of various blocks through periodic application of bias to the word lines, thus leading to increased Vt margin between the Vt distributions of different program states. However, periodically applying a voltage to the word lines between host commands may lead to increased power consumption and system overhead. For instance, unconditionally applying a positive bias to word lines of multiple blocks every few minutes may result in higher currents (e.g., Icc) and inefficiently consume power and overhead of the flash storage device.

Therefore, to save power and system overhead, the flash storage device of the present disclosure may condition read refreshes based on any of the following approaches: an age of a block, a time at which data in the block is programmed, or a combination of either approach. In one example, a controller of the flash storage device may refrain from performing read refreshes in fresh blocks, and only perform read refreshes in cycled blocks. Here, a "fresh" block is a block having a number of P/E cycles less than a given age threshold (e.g., 1K or some other number), while a "cycled" block is a block having a number of P/E cycles greater than or equal to the given age threshold. For instance, the flash storage device may not apply dummy read pulses to word lines of a block having less than 1000 P/E cycles, but may apply dummy read pulses to word lines of a block having at least 1000 P/E cycles. This approach may efficiently save power and system overhead, since the Vt margin increase resulting from periodic application of a positive bias on the word line may generally be insignificant for fresh blocks but significant for cycled blocks.

In another example, the controller of the flash storage device may refrain from performing read refreshes in recently programmed blocks, and only perform read refreshes in older programmed blocks. Here, a "recently" programmed block is a block in which data has been programmed less than a threshold amount of time before the read refresh is scheduled to be performed (e.g., less than 1 month before the scheduled read refresh, or some other threshold amount of time), while an "older" programmed block is a block in which data has been programmed at least the threshold amount of time before the scheduled read refresh (e.g., at least 1 month before the scheduled read refresh, or some other threshold amount of time). For instance, the flash storage device may store a time tag indicating when data in a block has been programmed, and if the length of time between the scheduled read refresh and the time indicated in the time tag is less than the threshold amount of time (i.e., the block is a recently programmed block), the flash storage device may not apply dummy read pulses to word lines of the block. On the other hand, if the length of time between the scheduled read refresh and the time indicated in the time tag is greater than or equal to the threshold amount of time (i.e., the block is an older programmed block), the controller may apply the dummy read pulses in periodic read refreshes. This approach may efficiently save power and system overhead, since the Vt margin increase resulting from periodic application of a positive bias on the word line may generally be insignificant for recently programmed blocks but may be significant for older programmed blocks.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
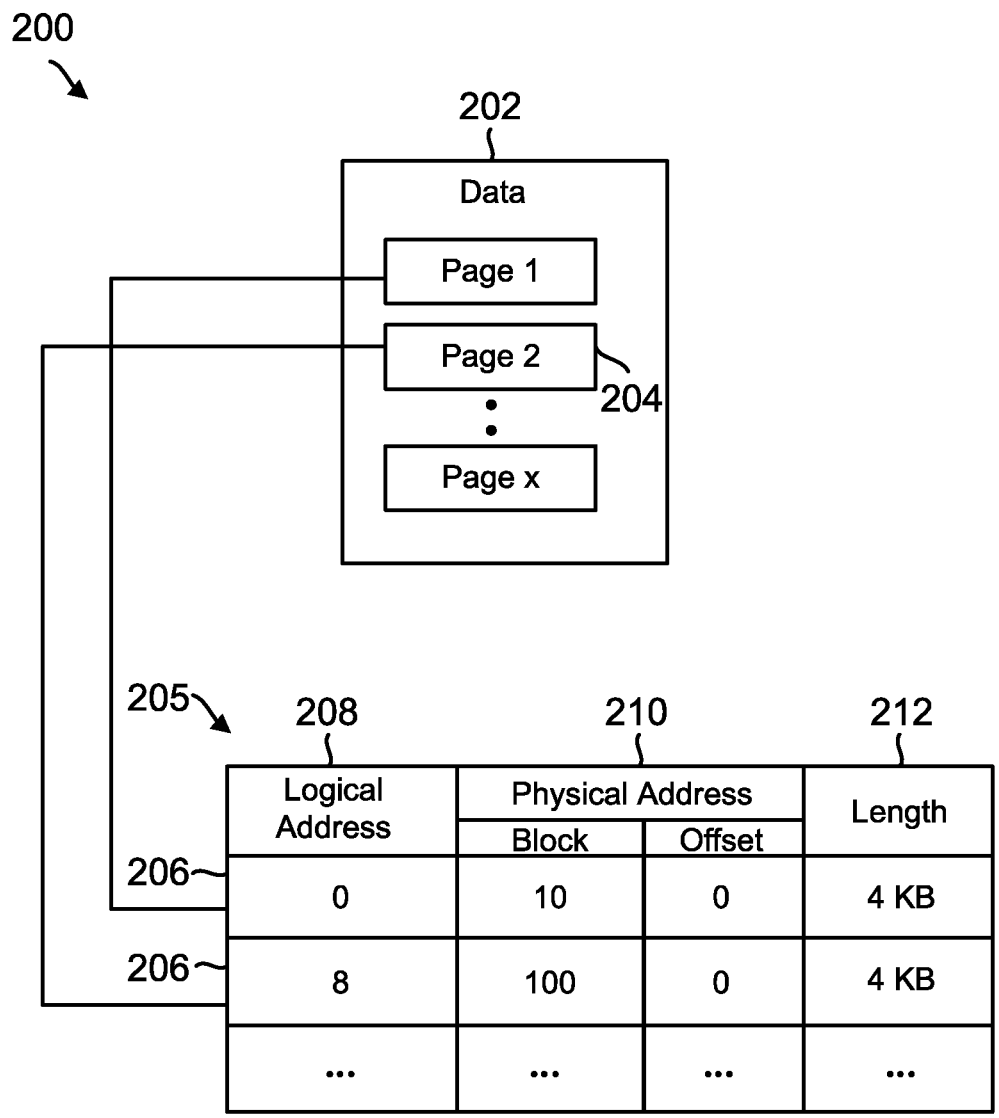
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
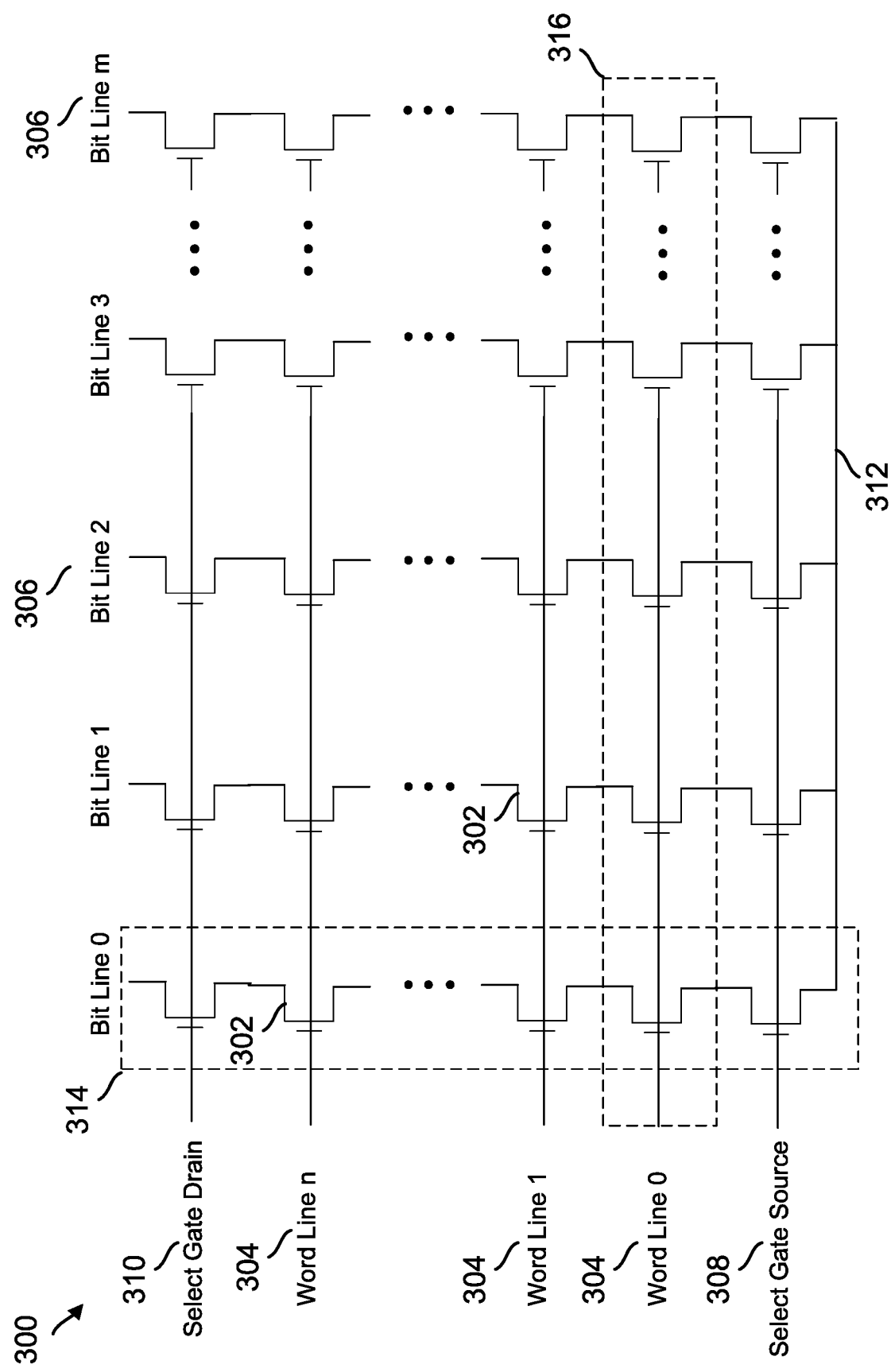
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
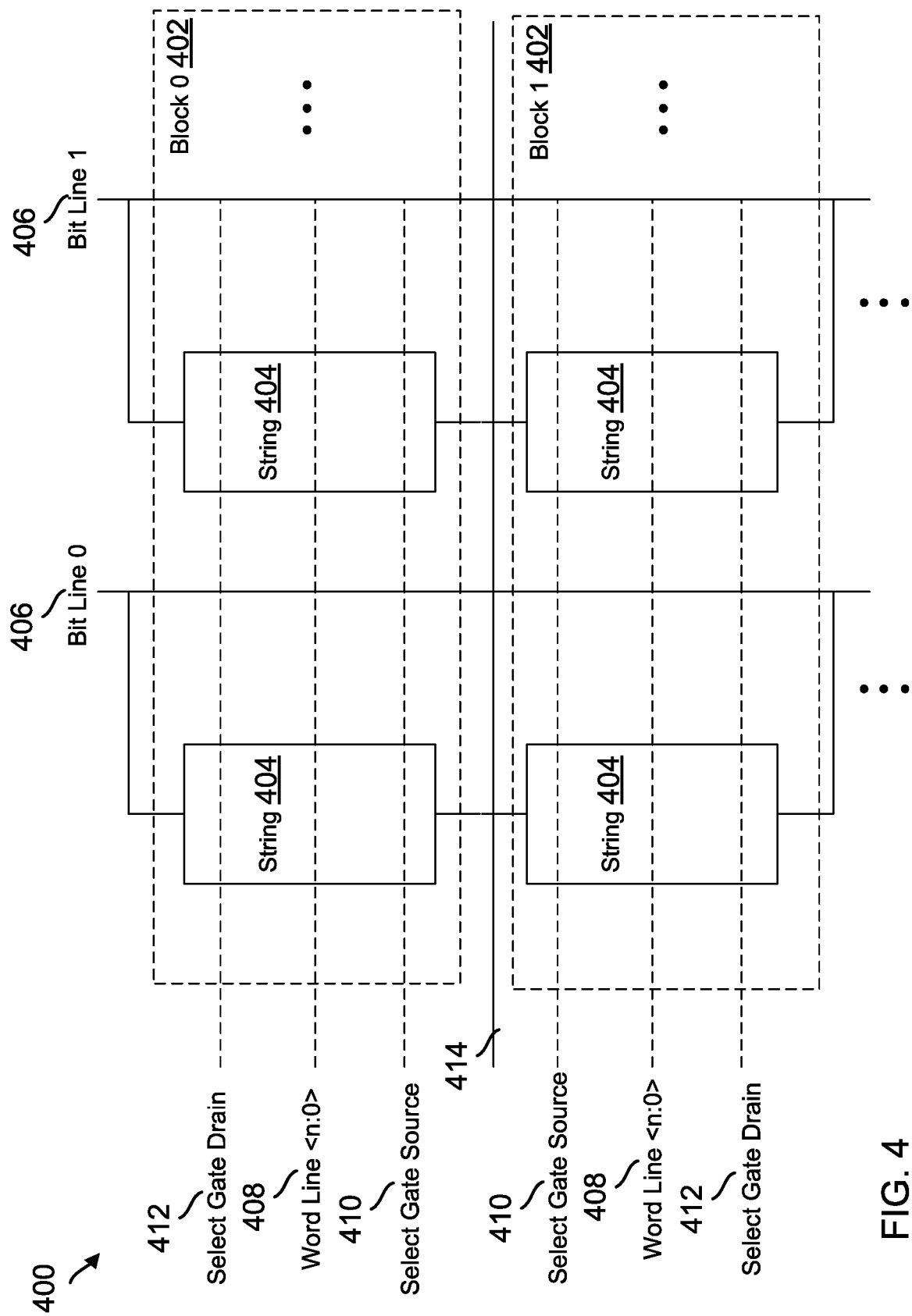
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response to the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
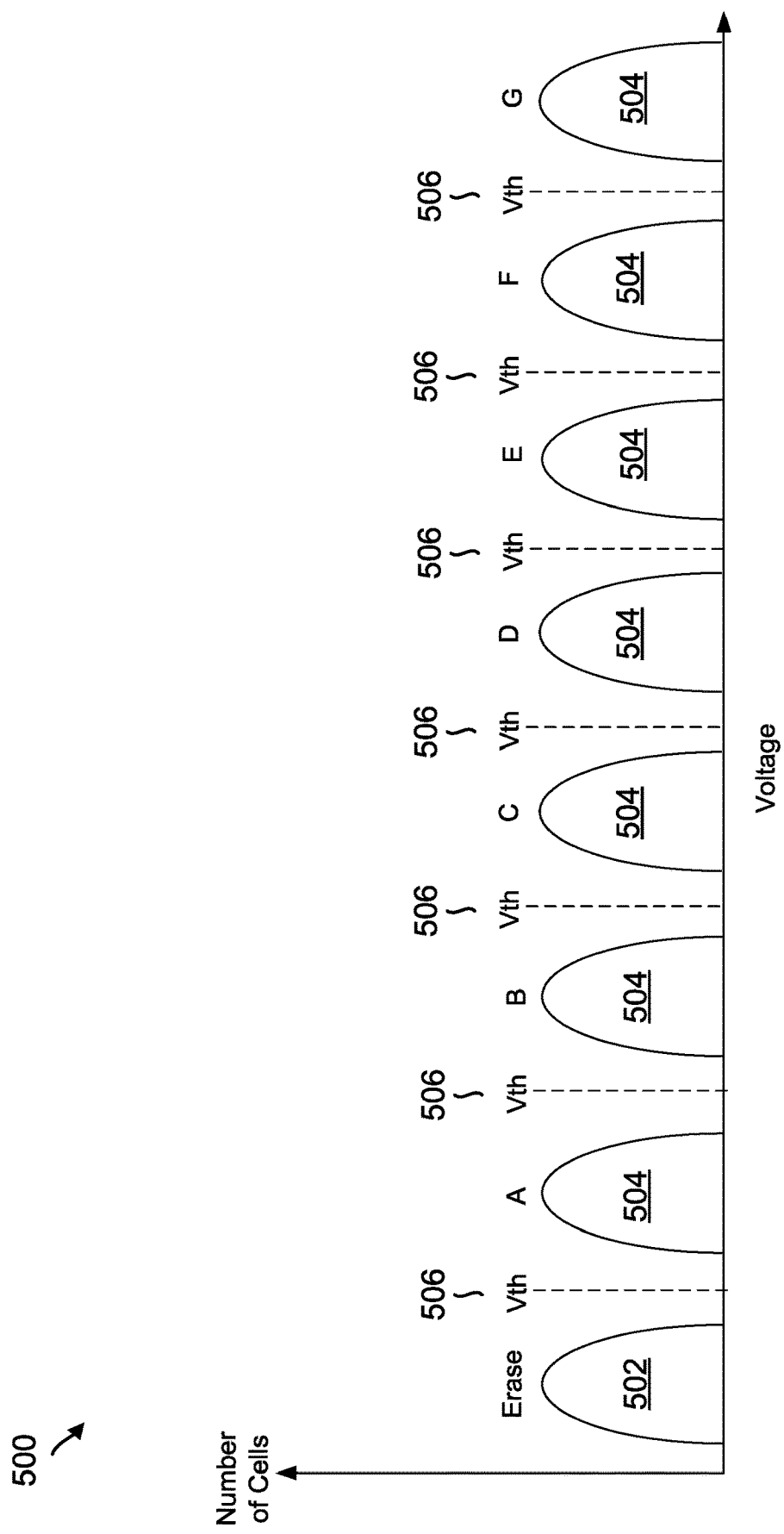
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 (e.g., S0) corresponding to logic '111' and multiple program states 504 (e.g. A-G, or S1-S7) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g., erase/S0 and A/S1, such as logic 0 and logic 1), MLCs may have four states (e.g., erase/S0 and A-C/S1-S3, such as logic 00, 01, 10, 11), and QLCs may have sixteen states (e.g. erase/S0 and A-N/S1-S15).

Over time, cells 116, 302 may experience charge loss, and thus reduction of threshold voltages 506, due to migration or de-trapping of electrons from the charge trapping layer (CTL) of the cells. The migration may occur in the direction of a blocking oxide layer (BLK) of a cell or in the direction of a tunnel oxide layer (TNL) of a cell. For instance, FIG. 6A illustrates an example 600 of charge that may leave the CTL either in direction (1) through the BLK or in direction (2) through the TNL when the cells are in a neutral state (without an applied bias). Moreover, the rate of charge migration may accelerate or decelerate in a given direction (BLK or TNL) depending on whether a positive or negative bias is applied to the cells. For example, if a positive bias is applied to the gate of the cells, direction (1) may be dominant, while if a negative bias is applied to the gate of the cells, direction (2) may be dominant for these cells. For instance, FIG. 6B illustrates an example 620 of charge that migrates from the CTL through the BLK predominantly in direction (1) in response to an applied positive bias Ve, while FIG. 6C illustrates an example 640 of charge that migrates from the CTL through the TNL predominantly in direction (2) in response to an applied negative bias –Ve.

Figure 7:
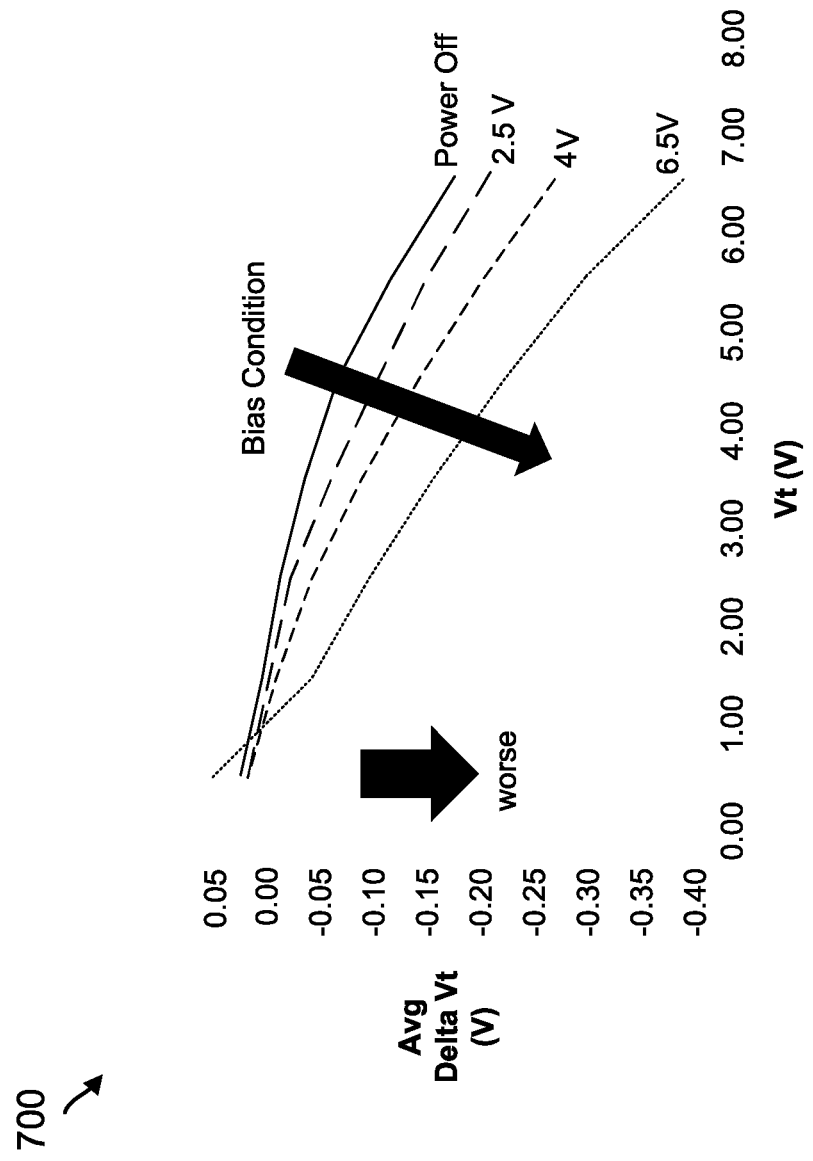
FIG. 7 is a graphical diagram illustrating examples of average drops in cell voltage thresholds in response to different positive biases applied to the cells.

FIG. 7 depicts a graph 700 showing examples of average drops in cell voltage thresholds (e.g., the threshold voltages 506 of FIG. 5) in response to different positive biases applied to the cells (e.g., Ve in FIG. 6B). For instance, the average change (delta) in Vt in the various cells monotonously decreases from the neutral state across the Vts for different positive bias conditions (e.g., 2.5 V bias, 4 V bias, and 6.5 V bias). The illustrated results corroborate the expectation that median cells may discharge through direction (1) in response to an applied positive bias, as referenced in FIG. 6B.

Figure 8:
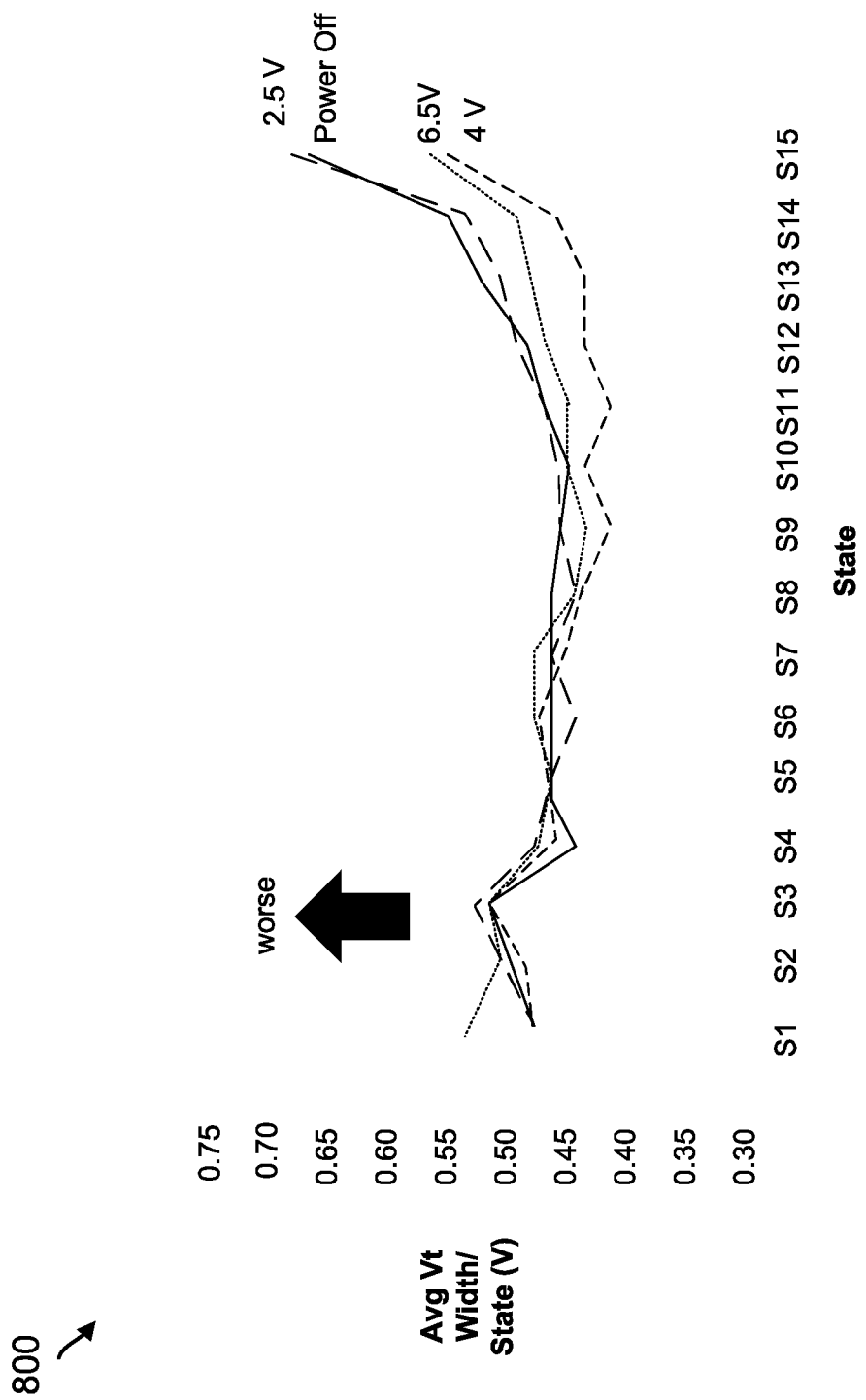
FIG. 8 is a graphical diagram illustrating examples of average cell voltage threshold widths for different program states in response to different positive biases applied to the cells.

Nevertheless, even though the Vt of the median cells may degrade at an accelerated rate in response to an applied positive bias, the average Vt distribution width may tighten and thus improve the margin between program state distributions. For instance, FIG. 8 depicts a graph 800 showing that the average cell Vt width for different program states may decrease from that of a neutral/power off state (i.e., tighten) in response to an applied positive bias. These results indicate that the median cells, or the cells occupying the majority of the Vt distribution for those states, and the lower tail cells, which occupy a minority of the Vt distribution for those states, discharge in different directions from the CTL. That is, since the median cells are understood to discharge in direction (1) towards the BLK in response to a positive bias as described above in FIGS. 6B and 7, the lower tail cells would discharge in the opposite direction (2) towards the TNL.

Figure 9:
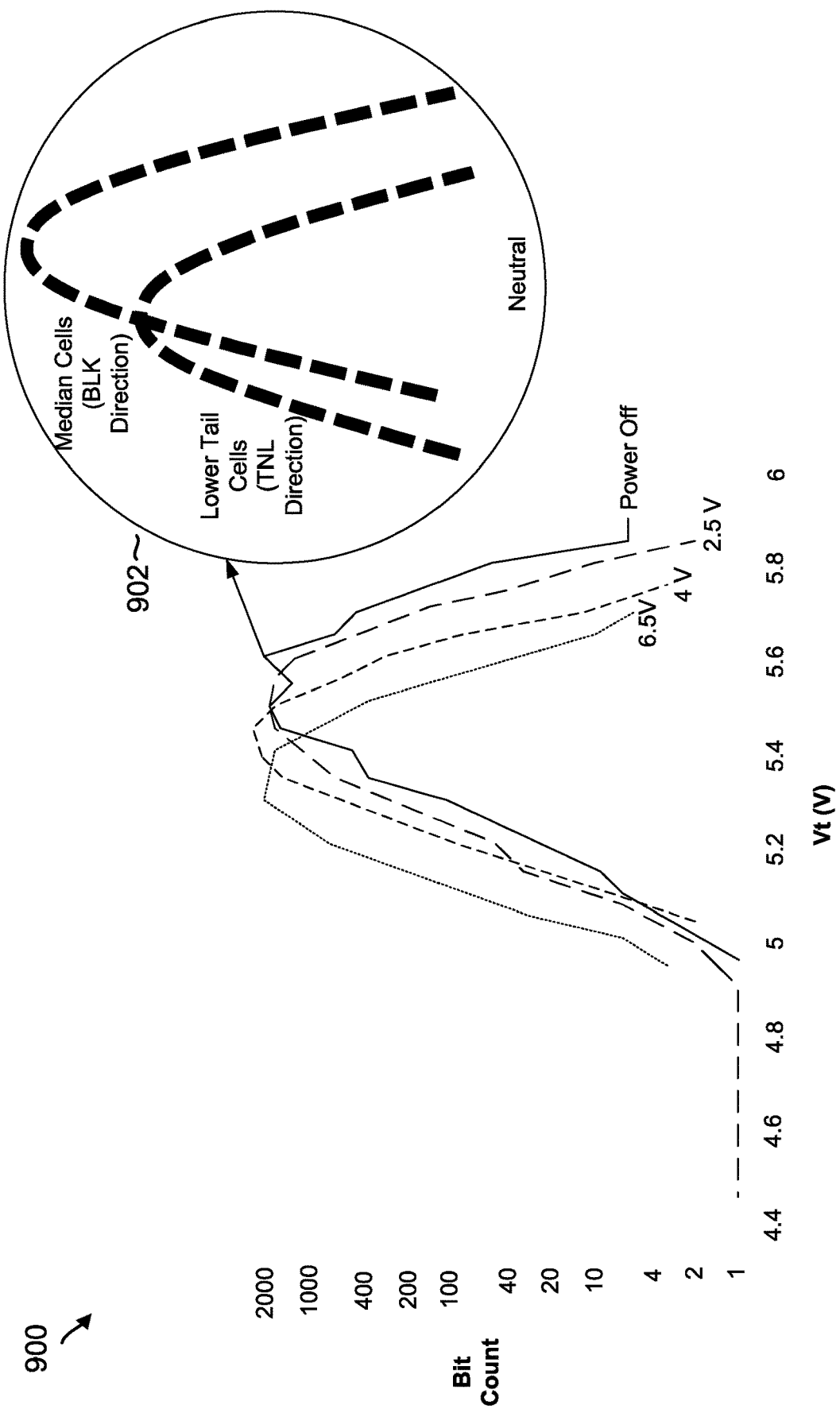
FIG. 9 is a graphical diagram illustrating examples of cell voltage threshold distributions for different positive biases applied to the cells.

FIG. 9 depicts a graph 900 showing an example of Vt distributions for cells in a given program state in response to different bias conditions. Each Vt distribution for a given bias condition may be considered to have multiple component distributions, such as illustrated at 902. For instance, FIG. 9 illustrates two component distributions of neutral state Vts, one including the Vts of median cells that discharge in the BLK direction (1), and another including the Vts of lower tail cells which discharge in the TNL direction (2). These distributions may shift differently depending on whether a positive or negative bias is applied, such as illustrated in FIGS. 10 and 11, respectively.

Figure 10:
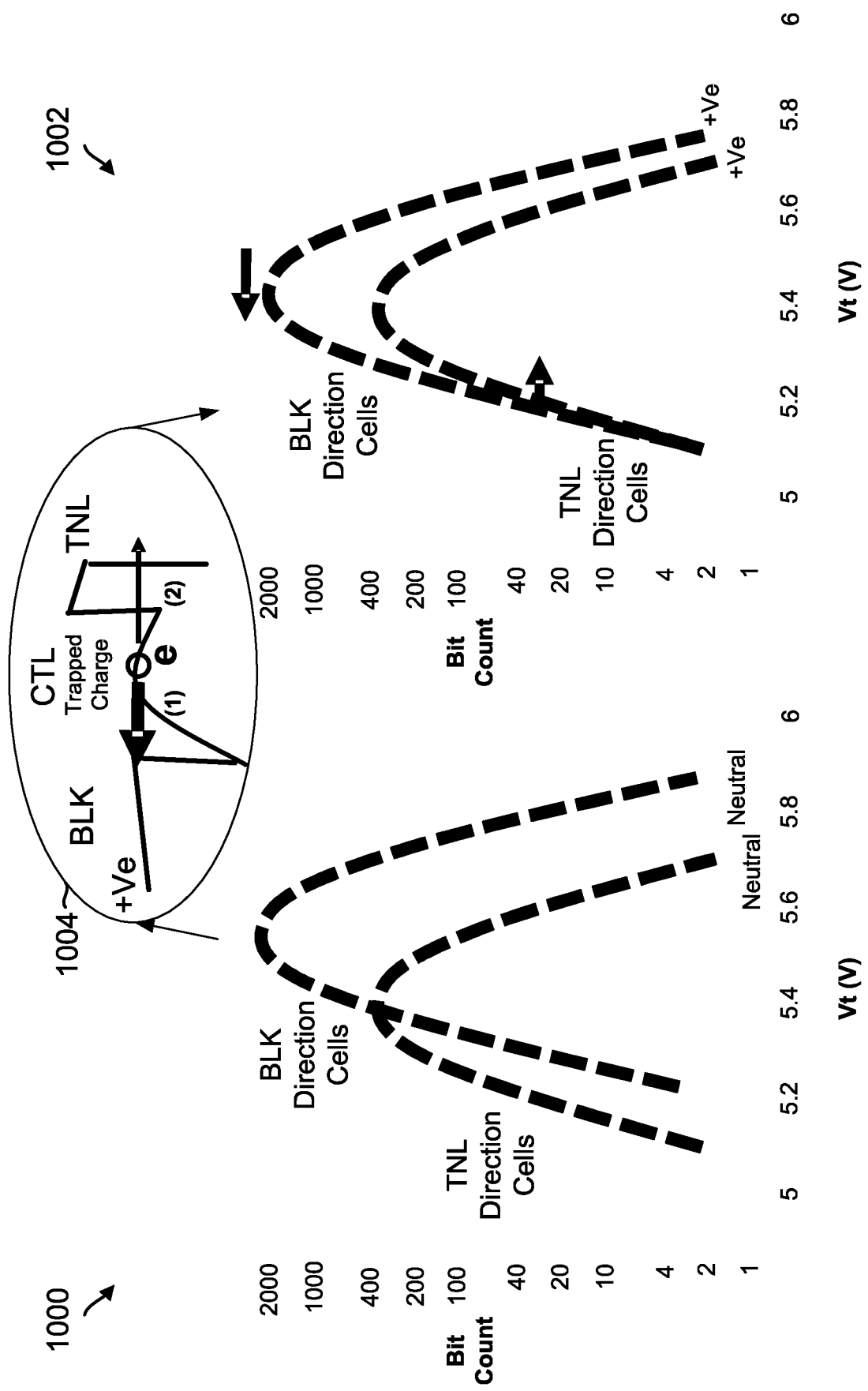
FIG. 10 is a graphical diagram illustrating an example of a median and lower tail shift in the cell voltage distribution of FIG. 9 in response to a positive bias applied to the cells.
Figure 11:
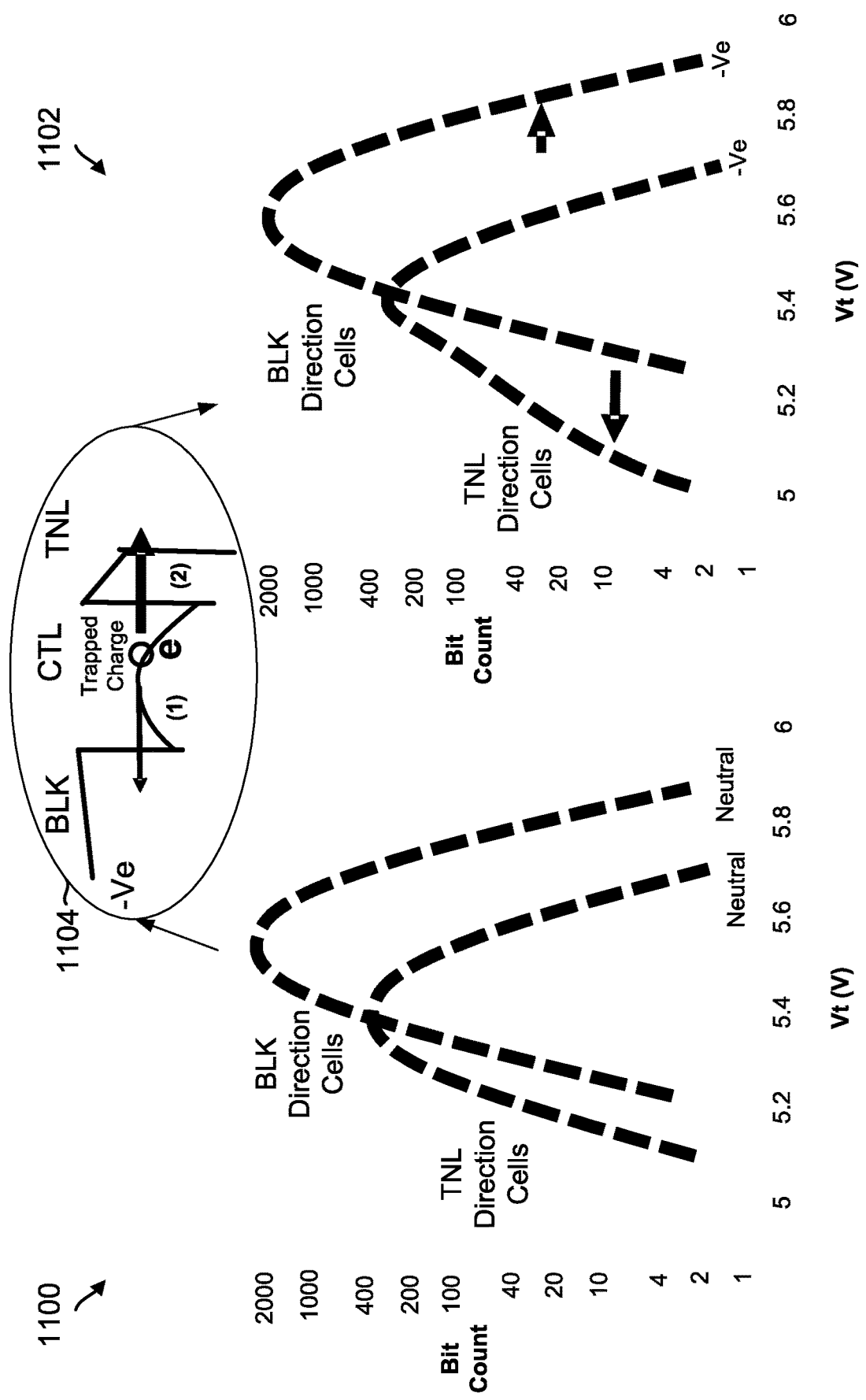
FIG. 11 is a graphical diagram illustrating an example of a median and lower tail shift in the cell voltage distribution of FIG. 9 in response to a negative bias applied to the cells.

For instance, FIG. 10 illustrates examples of graphs 1000, 1002 showing a change in the component Vt distributions of the power off curve of FIG. 9 in response to an applied positive bias Ve, as illustrated at 1004 and similarly in FIG. 6B. Here, when a positive bias is applied to the cells, the Vts of the BLK direction cells may decrease (i.e., shift left on the graph 1002 with respect to graph 1000) while the Vt of the TNL direction cells may slightly increase (i.e., shift right on the graph 1002 with respect to graph 1000). Moreover, FIG. 11 illustrates examples of graphs 1100, 1102 showing a change in the component Vt distributions of the power off curve of FIG. 9 in response to an applied negative bias –Ve, as illustrated at 1104 and similarly in FIG. 6C. Here, when a negative bias is applied to the cells, the Vt of the BLK direction cells may increase (i.e., shift right on the graph 1102 with respect to graph 1100) while the Vt of the TNL direction cells may slightly decrease (i.e., shift left on the graph 1102 with respect to graph 1100).

Figure 12:
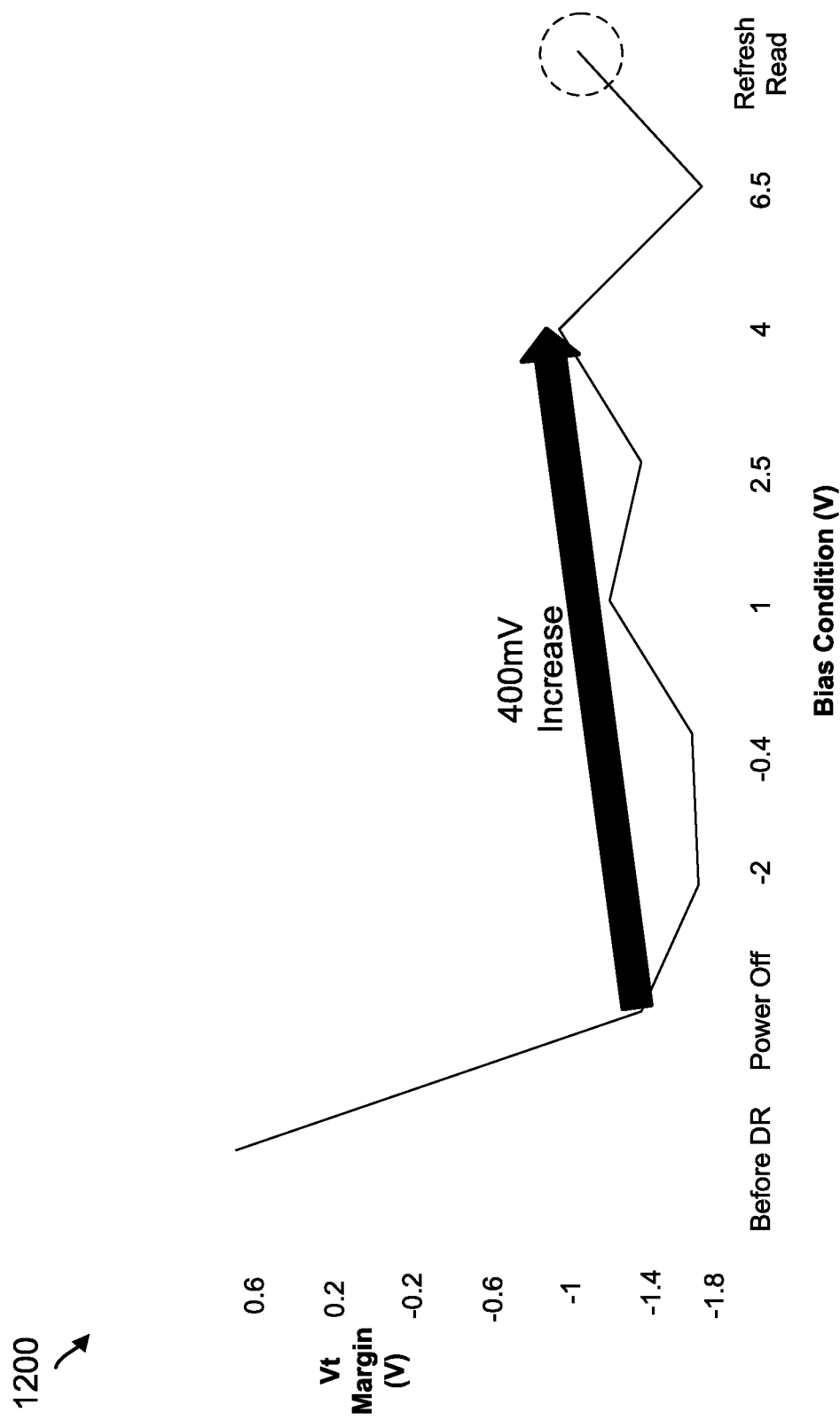
FIG. 12 is a graphical diagram illustrating examples of changes in cell voltage threshold margins in response to different positive, negative, and neutral biases applied to the cells.

Thus, in contrast to negative biasing, positive biasing may tighten the Vt distribution width of a given program state, leading to improved Vt margin between different program state distributions. For instance, FIG. 12 illustrates an example 1200 showing a change in Vt margin for different positive bias conditions, where an optimum margin of ~400 mV may be gained in response to application of a constant, 4 V positive bias to the cells. Thus, applying a constant 4 V bias to the cells 116, 302 coupled to word lines 304, 408 in blocks 402 may cause the gap between Vt distributions for each of the program states 504 in FIG. 5 to widen by ~400 mV, resulting in less likelihood of Vt overlap between states.

Figure 13:
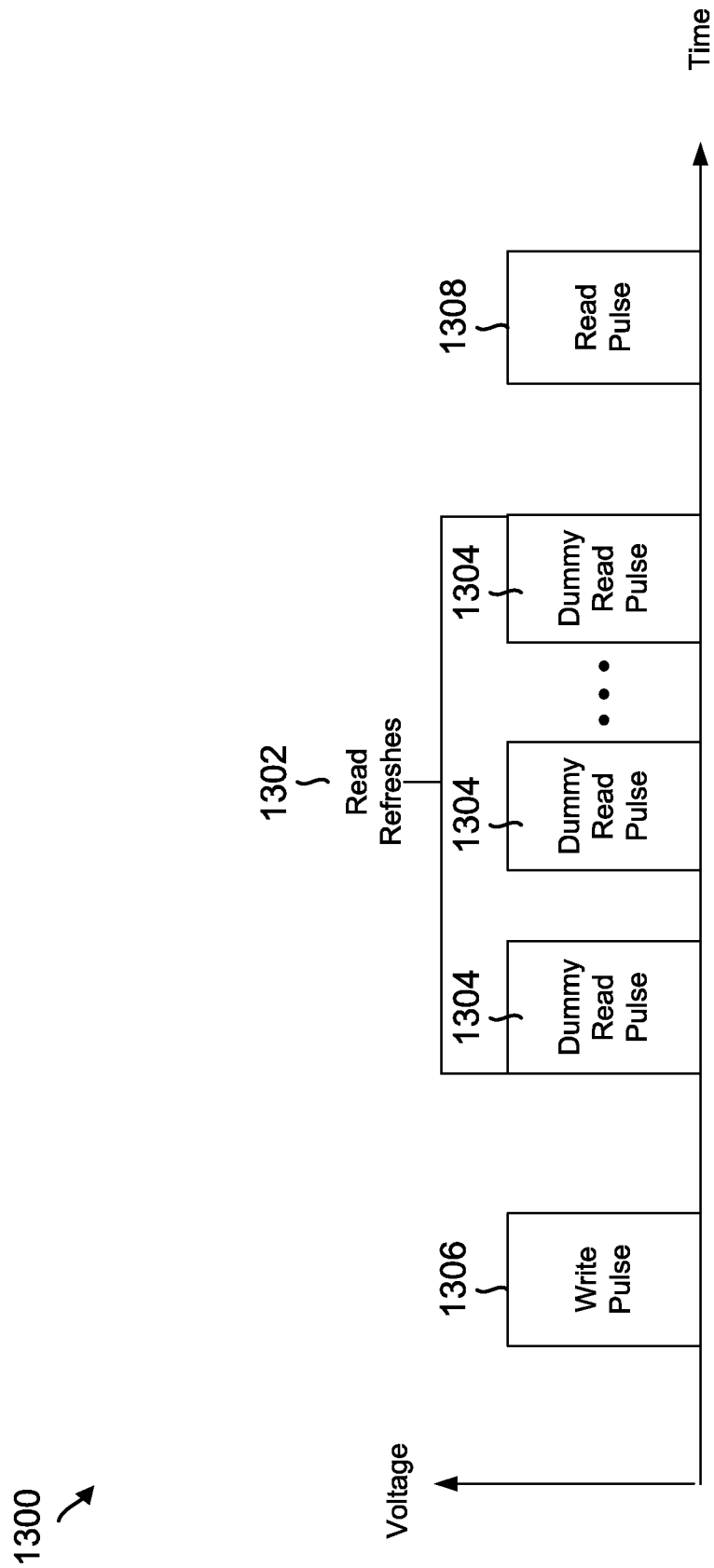
FIG. 13 is a graphical diagram illustrating an example of read refresh timing.

Additionally, Vt margin may further be improved by refresh reads. For instance, FIG. 13 depicts an example 1300 of a timing diagram for read refreshes 1302 that the controller 123 may apply to word lines 304, 408 between execution of host commands. During a refresh read, when the controller 123 is not executing a host command, the controller may apply one or more dummy read pulses 1304 to the word lines to maintain the charge and thus the DR of the cells coupled to those word lines and minimize subsequent read errors. For example, after applying a program voltage or write pulse 1306 to the word line in response to a write command, the controller may perform a read refresh (e.g., apply one of the dummy read pulses 1304) every 3 minutes to re-charge the cells until the controller subsequently applies a read voltage or read pulse 1308 to the word line in response to a read command. As a result of this periodic application of a positive bias, an improved Vt margin similar to that shown in FIG. 12 may result. For instance, a comparable Vt margin improvement of ~400 mV with respect to a power off state may occur in response to refresh reads. Thus, the gap between each of the program states 504 in FIG. 5 may similarly widen by ~400 mV in response to the refresh reads, also resulting in less likelihood of Vt overlap between states.

However, applying read refreshes 1302 unconditionally may utilize significant power and system overhead. For instance, if the controller 123 applies dummy read pulses 1304 to multiple word lines 304, 408 in multiple blocks 402 in periodic intervals between host commands, the storage device 102 may experience current for a significant length of time, inefficiently wasting power of the storage device. Moreover, the time and resources spent by the controller in applying the dummy read pulses 1304 to various blocks may inefficiently result in high system overhead.

Accordingly, to save power and system overhead, the controller 123 may conditionally apply read refreshes 1302 based on P/E cycles, program timing, or a combination of P/E cycles and program timing. In a first example approach, the controller 123 may refrain from applying read refreshes 1302 to cells in a block of a die if an age of the die is less than a certain threshold (e.g., an age threshold). The age threshold may be in units of number of P/E cycles (e.g., a threshold of 1K P/E cycles or some other value). For example, the controller may identify a number of P/E cycles of each block in the die, calculate an average number of P/E cycles for the die (e.g., the total number of P/E cycles across all blocks divided by the total number of blocks), and refrain from applying the read refreshes 1302 if the average number of P/E cycles is less than the age threshold (1K). Alternatively, the controller may determine the age of the die in other ways, and refrain from applying the read refreshes based on the age of the die accordingly. Once the age of the die exceeds the age threshold (e.g., at least 1K in the above example), the controller may apply the read refreshes 1302 to the word lines of the blocks in that die as previously described.

In a second example approach, the controller 123 may refrain from applying read refreshes 1302 to cells in a recently programmed block or set of blocks. For instance, before or after the controller applies a program voltage to write data in one or more blocks, the controller may store a time tag indicating when the block(s) were programmed. For example, the time tag may indicate a time when the program voltage or write pulse 1306 was applied to the word line(s) 304, 408 of the block(s) 402. The controller may store the time tag in a special block within the NVM 110 (e.g., a control block storing system information, or some other block not storing host data), or outside the NVM but elsewhere within the storage device 102 (e.g., in controller memory). The controller may refrain from applying the read refreshes 1302 until a threshold amount of time has elapsed since the time indicated in the time tag. After the threshold amount of time has elapsed, the controller may apply the read refreshes 1302 to the word lines as previously described.

The controller may apply either the first example approach, second example approach, or a combination of the first and second example approaches when conditioning read refreshes. For example, the controller may refrain from applying read refreshes 1302 in blocks of a die having a number of P/E cycles less than an age threshold until a threshold amount of time has elapsed since a programming time indicated in a time tag. In this example, if the number of PIE cycles of that die exceeds the age threshold, or if the threshold amount of time has elapsed, the controller may perform the read refreshes 1302 in that block; otherwise, until both conditions are met, the controller refrains from performing read refreshes. In other examples, the controller may perform the read refreshes in response to only one of those conditions being met.

Figure 14:
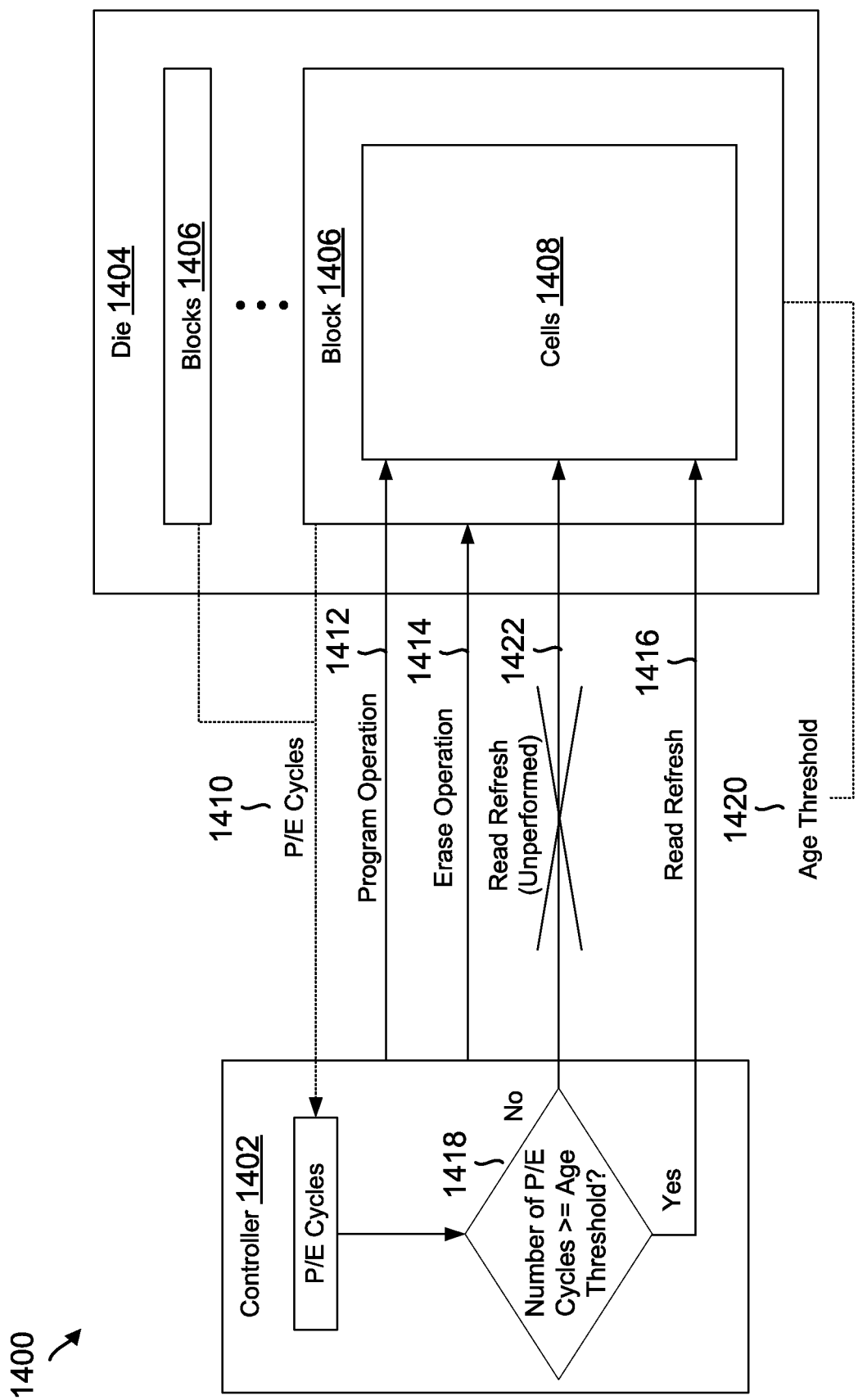
FIG. 14 is a conceptual diagram illustrating an example of conditional read refreshes performed by a controller in the storage device of FIG. 1.

FIG. 14 illustrates an example 1400 of the first aforementioned approach, in which a controller 1402 performs conditional read refreshes based on an age of a die 1404. The die 1404 includes blocks 1406, and each of the blocks includes cells 1408. Controller 1402 may correspond to controller 123 of FIG. 1, die 1404 may correspond to die 114 of FIG. 1, blocks 1406 may correspond to blocks 402 of FIG. 4, and cells 1408 may correspond to cells 116, 302 of FIGS. 1 and 3 respectively. The controller 1402 may track a number of PIE cycles 1410 of each of the blocks 1406. For example, after the controller executes a program operation 1412 to program data in one or more cells 1408 of one of the blocks 1406, and subsequently an erase operation 1414 to erase the data programmed in that block, the controller may update a number of P/E cycles for that block. The controller may track P/E cycles similarly for each block and may store the numbers of P/E cycles for the blocks in volatile memory or in the NVM 110.

Between host commands (e.g., read or write commands), the controller 1402 may periodically perform read refreshes 1416 in one or more of the blocks 1406 to maintain data integrity and retention in the cells of those blocks. For instance, the controller may periodically apply a dummy read pulse to a word line coupled to the cells 1408 in that block, which may result in the benefit of increased Vt margin between cell Vt distributions of adjacent program states at the cost of increased power consumption or system overhead. To balance the benefit with the cost of read refresh in one or more blocks, the controller may determine at 1418 whether a number of P/E cycles of those block(s) meets or exceeds an age threshold 1420 (e.g., 1K P/E cycles or some other number). For example, the controller may determine an average number of P/E cycles of all of the blocks 1406 in die 1404, or some other statistic with respect to the P/E cycles, and the controller may compare that statistic with the age threshold. Alternatively, the controller may compare the number of P/E cycles directly with the age threshold. If the controller determines at 1418 that the number (or statistic) is less than the age threshold 1420 (e.g., the block(s) each have less than 1K cycles, in total have an average less than 1K cycles, etc.), the controller may refrain from performing read refreshes 1416 as illustrated at 1422. Otherwise, if the controller determines at 1418 that the number (or statistic) is greater than or equal to the age threshold 1420 (e.g., the block(s) each have at least 1K cycles, in total have an average of at least 1K cycles, etc.), the controller may perform the read refreshes 1416 in those block(s). Thus, the controller may refrain from performing read refreshes 1416 in fresh blocks, where read refreshes may provide less significant Vt margin improvement, while performing read refreshes in cycled blocks, where read refreshes may provide more significant Vt margin improvement, efficiently saving power and system overhead.

Figure 15:
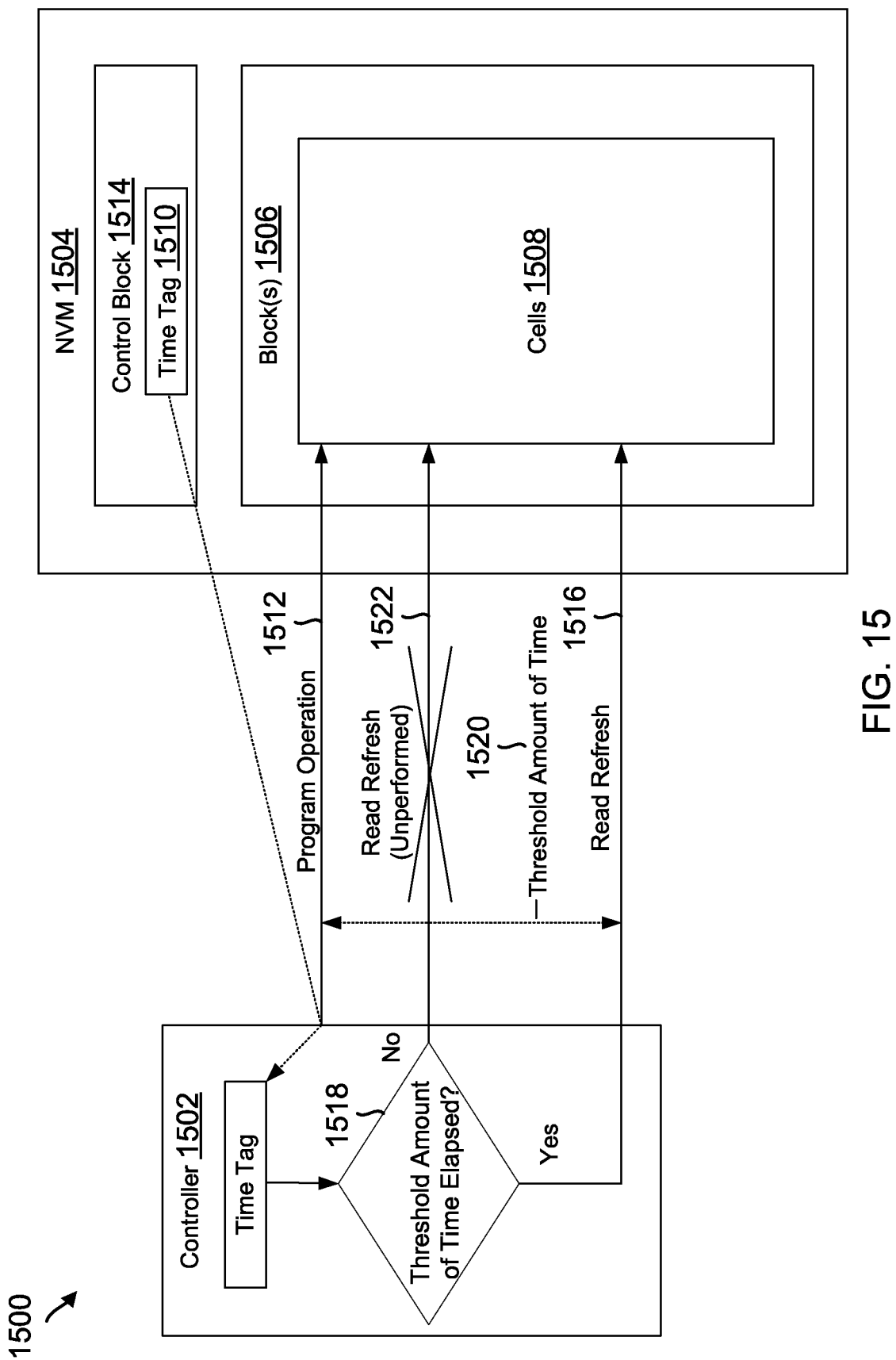
FIG. 15 is a conceptual diagram illustrating another example of conditional read refreshes performed by a controller in the storage device of FIG. 1.

FIG. 15 illustrates an example 1500 of the second aforementioned approach, in which a controller 1502 performs conditional read refreshes in NVM 1504 based on a time in which the controller programs data in a block 1506 of the NVM. The NVM 1504 includes multiple blocks, and each of the blocks includes cells 1508. Controller 1502 may correspond to controller 123 of FIG. 1, NVM 1504 may correspond to NVM 110 of FIG. 1, blocks 1506 may correspond to blocks 402 of FIG. 4, and cells 1508 may correspond to cells 116, 302 of FIGS. 1 and 3 respectively. The controller 1502 may store a time tag 1510 or other indicator for each of the blocks 1506 indicating a time at which the controller last programmed data in that block. For example, after the controller executes a program operation 1512 to program data in one or more cells 1508 of one or more of the blocks 1506, the controller may store the time when the program operation was executed in time tag 1510. For example, the controller may store the time tag 1510 (or other indicator) in a control block 1514 of the NVM 1504. In addition to storing the time tag for each block, the control block 1514 may store system information for the NVM 1504 other than host data (e.g., L2P mapping tables, file system data, etc.). Alternatively, the controller may store the time tag (or other indicator) in memory outside of the NVM 1504.

Between host commands (e.g., read or write commands), the controller 1502 may periodically perform read refreshes 1516 in one or more of the blocks 1506 to maintain data integrity and retention in the cells of those blocks. For instance, the controller may periodically apply a dummy read pulse to a word line coupled to the cells 1508 in that block, which may result in the benefit of increased Vt margin between cell Vt distributions of adjacent program states at the cost of increased power consumption or system overhead. Accordingly, to balance the benefit with the cost of read refresh in one or more blocks, the controller may determine at 1518 whether a threshold amount of time 1520 has elapsed since the time one or more cells in the block(s) were last programmed. For example, the controller may calculate a difference in time between a scheduled read refresh for a block and a time indicated in the stored time tag for that block, and the controller may compare that difference with the threshold amount of time. If the controller determines at 1518 that the time difference is currently less than the threshold amount of time 1520 (e.g., data in the blocks was programmed recently), the controller may refrain from performing read refreshes 1516 in those block(s) as illustrated at 1522. Otherwise, if the controller determines at 1518 that the time difference is currently greater than or equal to the threshold amount of time 1520 (e.g., data in the blocks was not programmed recently), the controller may perform the read refreshes 1516 in those block(s). Thus, the controller may refrain from performing read refreshes 1516 in recently programmed blocks, where read refreshes may provide less significant Vt margin improvement, while performing read refreshes in older programmed blocks, where read refreshes may provide more significant Vt margin improvement, efficiently saving power and system overhead.

While FIGS. 14 and 15 represent individual examples of conditional read refresh, the controller may combine the aforementioned examples when performing or refraining from performing read refreshes. For instance, the controller may make both determinations at 1418 and 1518, in response to which determinations the controller may either perform read refreshes 1416, 1516 or refrain from performing read refreshes as illustrated at 1422 and 1522. For example, the controller may perform read refreshes 1416, 1516 if the number of PIE cycles 1410 is greater than or equal to the age threshold 1420 and if the threshold amount of time 1520 has elapsed since the time indicated in time tag 1510; otherwise, if both conditions are not met, the controller may refrain from performing the read refreshes. Thus, the controller may refrain from performing read refreshes in fresh or recently programmed blocks, while performing read refreshes only in cycled and older programmed blocks.

Figure 16:
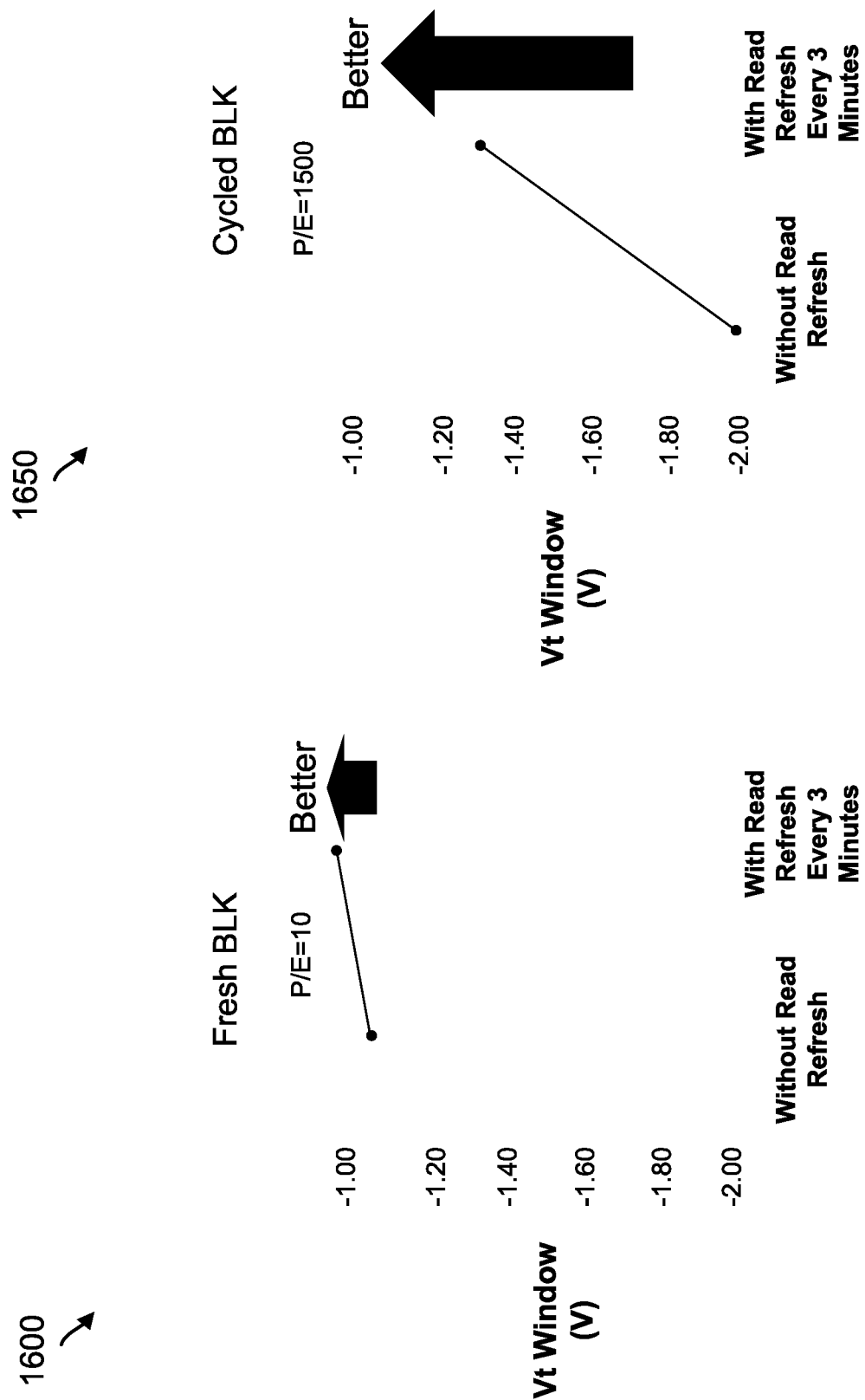
FIGS. 16A-16B are graphical diagrams illustrating a difference between fresh blocks and cycled blocks with respect to voltage threshold margin changes in response to read refreshes.

FIGS. 16A and 16B respectively illustrate examples 1600, 1650 of graphs showing the significant difference in Vt margin improvement between fresh and cycled blocks in response to read refreshes. For instance, FIG. 16A shows an example of a fresh block with 10 P/E cycles (below the aforementioned age threshold), and FIG. 16B shows an example of a cycled block with 1500 P/E cycles (above the aforementioned age threshold). The figures illustrate that for a block with merely 10 P/E cycles (e.g., a fresher block), the Vt margin may increase at a smaller rate in response to periodic read refreshes (every 3 minutes in this example) than for a block with 1500 P/E cycles (e.g., a less fresh block). Similar differences in Vt margins may also be experienced between recently programmed blocks and older programmed blocks. Thus, the conditional read refresh performed by the controller of the present disclosure may efficiently balance the benefit of improved Vt margin with the costs of power and system overhead caused by refresh reads.

Figure 17:
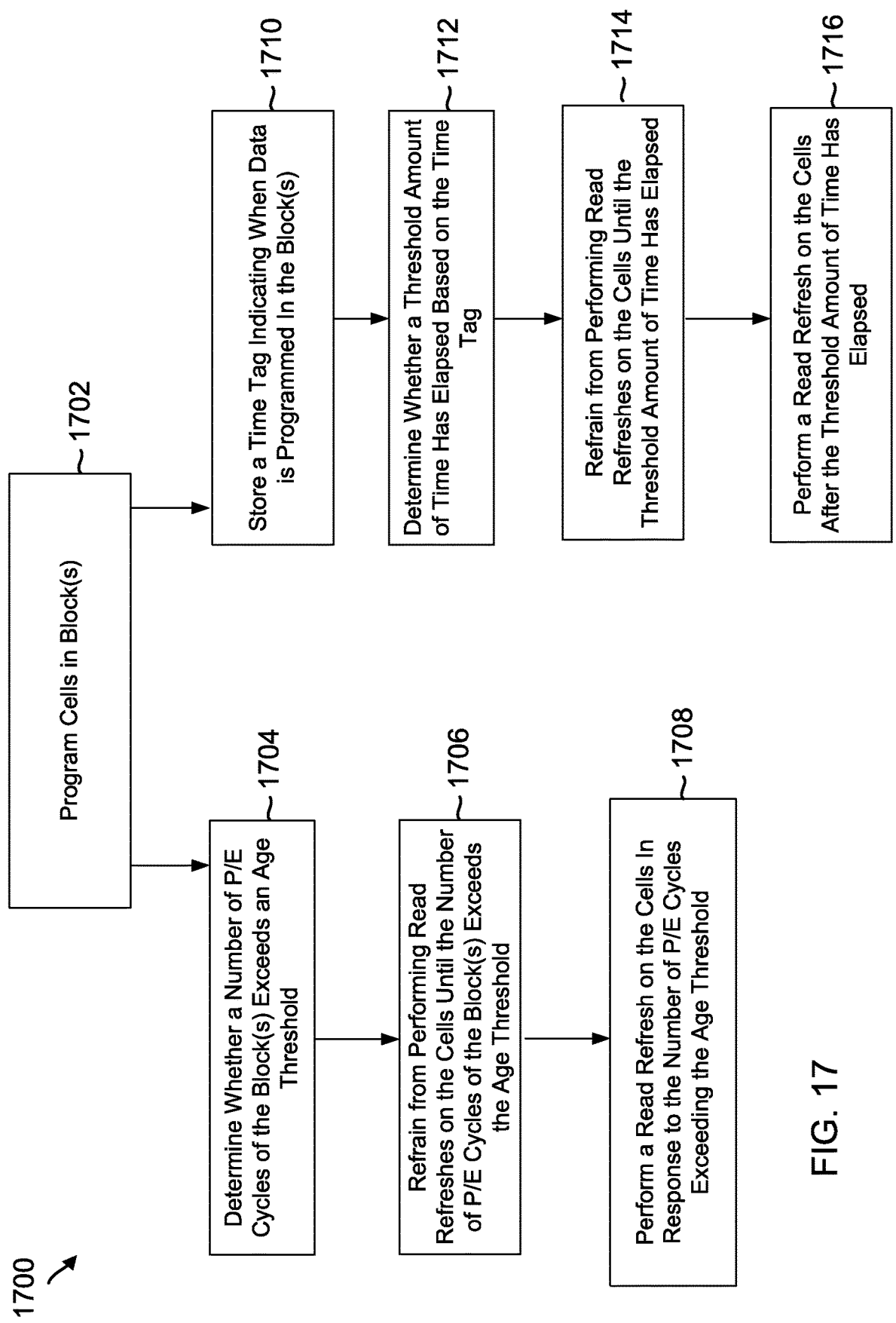
FIG. 17 is a flow chart illustrating an example of a method for performing conditional read refreshes, as performed by the storage device of FIG. 1.

FIG. 17 illustrates an example flow chart 1700 of a method for performing conditional read refresh. For example, the method can be carried out in a storage device 102 such as the one illustrated in FIG. 1. Each of the steps in the flow chart can be controlled using the controller as described below (e.g. controller 123, 1402, 1502), by a component or module of the controller, or by some other suitable means.

As represented by block 1702, the controller may program cells in block(s). For instance, referring to the aforementioned figures, the controller 123, 1402, 1502 may program data 119 in cells 116, 302 coupled to word lines 304, 408 in one or more blocks 402, 1406, 1506.

As represented by block 1704, the controller may determine whether a number of PIE cycles of the block(s) exceeds an age threshold. For instance, referring to the aforementioned figures, the controller 123, 1402, 1502 may determine at 1418 whether a number of P/E cycles 1410 of the blocks 402, 1406, 1506 exceeds an age threshold 1420 (e.g., 1K). If the number of P/E cycles of a block is less than the age threshold, then as represented by block 1706, the controller may refrain from performing read refreshes on the cells in that block until the number of P/E cycles of that block later exceeds the age threshold. For instance, referring to the aforementioned figures, the controller 123, 1402, 1502 may refrain from performing read refreshes 1416 in the blocks 1406 whose number (or statistic) of P/E cycles does not exceed the age threshold, as illustrated at 1422. Otherwise, if the number of P/E cycles of the block is greater than or equal to the age threshold, then as represented by block 1708, the controller may perform a read refresh on the cells in that block. For instance, referring to the aforementioned figures, the controller 123, 1402, 1502 may perform read refreshes 1416 in the blocks 1406 whose number (or statistic) of P/E cycles exceeds the age threshold.

Additionally or alternatively, as represented by block 1710, the controller may store a time tag indicating when the data is programmed at block 1702 in the block. For instance, referring to the aforementioned figures, the controller 123, 1402, 1502 may store the time tag 1510 indicating a time at which program operation 1512 in one or more of the blocks 1506 was executed. For example, the controller may store the time tag 1510 in a control block 1514 of the NVM 1504. Next, as represented by block 1712, the controller may determine whether a threshold amount of time has elapsed since the block was programmed as indicated in the time tag. For instance, referring to the aforementioned figures, the controller 123, 1402, 1502 may determine at 1518 whether a time difference between the time when program operation 1512 in the block(s) 1506 was executed and the indicated time in time tag 1510 exceeds a threshold amount of time 1520. If the time difference is less than the threshold amount of time, then as represented by block 1714, the controller may refrain from performing read refreshes on the cells in those block(s) until the threshold amount of time 1520 later elapses, as illustrated at 1522. Otherwise, if the time difference is greater than or equal to the threshold amount of time, then as represented by block 1716, the controller may perform a read refresh on the cells in those block(s). For instance, referring to the aforementioned figures, the controller 123, 1402, 1502 may perform read refreshes 1516 in the block(s) 1506 once the threshold amount of time 1520 since their last programming has elapsed.

Figure 18:
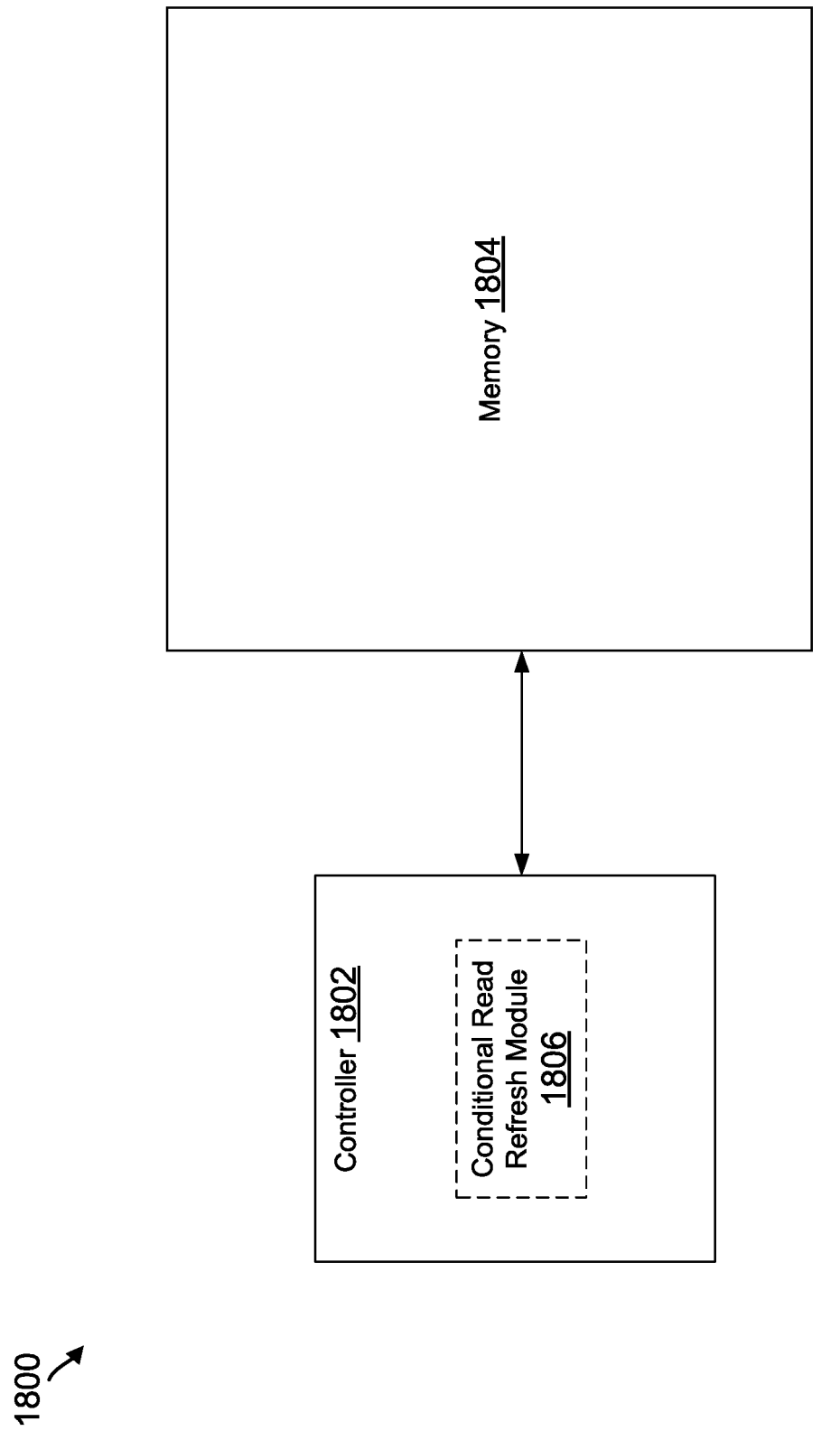
FIG. 18 is a conceptual diagram illustrating an example of a controller that performs conditional read refreshes in the storage device of FIG. 1.

FIG. 18 is a conceptual diagram illustrating an example 1800 of a controller 1802 coupled to a memory 1804 in a storage device. For example, controller 1802 may correspond to controller 123, 1402, 1502 and memory 1804 may correspond to the NVM 110 of the storage device 102 in FIG. 1. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

In one example, the controller 1802 includes a conditional read refresh module 1806 that may provide a means for performing a read refresh on the cells in response to a number of P/E cycles of the block exceeding an age threshold. For example, the conditional read refresh module 1806 may perform the processes or algorithms described above with respect to FIGS. 14 and 17. The conditional read refresh module 1806 may also provide a means for applying dummy read pulses to the cells after a threshold amount of time has elapsed since the block is programmed. For example, the conditional read refresh module 1806 may perform the processes or algorithms described above with respect to FIGS. 15 and 17. The conditional read refresh module 1806 may further provide a means for refraining from performing read refreshes on the cells until a number of PIE cycles of the block exceeds an age threshold and until a threshold amount of time has elapsed since the data is programmed in the block. For example, the conditional read refresh module 1806 may perform the processes or algorithms described above with respect to FIGS. 14, 15 and 17.

Thus, the controller of the present disclosure may apply conditional read refresh to efficiently balance Vt margin improvement for cycled or older programmed blocks, while saving power and system overhead for fresh or recently programmed blocks. The savings to system overhead may be especially desirable in cases where performance of the storage device is significant. Moreover, conditional read refresh based on tracking of program timing through time tags or other indicators may be desirable in cold data storage systems, where large chunks of data may be loaded into the storage device and maintained for a significant amount of time.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a memory including a block, the block including a plurality of cells; and
a controller coupled to the memory and configured to selectively perform a read refresh on the plurality of cells by applying periodic voltage read pulses to the plurality of cells without incurring a program/erase (P/E) cycle and without reading data in response to the periodic voltage read pulses in response to a number of P/E cycles of the block exceeding an age threshold,
wherein the periodic voltage read pulses are only performed on the plurality of cells based on the block exceeding the age threshold.

2. The storage device of claim 1, further comprising:
a die comprising a plurality of blocks including the block, wherein the controller is configured to perform the read refresh on the plurality of cells in response to an average number of P/E cycles of each of the plurality of blocks in the die exceeding the age threshold.

3. The storage device of claim 2, wherein the controller is configured to refrain from performing read refreshes on the plurality of cells until the average number of P/E cycles of each of the plurality of blocks in the die exceeds the age threshold.

4. The storage device of claim 1, wherein the controller is configured to program the block, and to perform the read refresh on the plurality of cells a threshold amount of time after the block is programmed.

5. The storage device of claim 4, wherein the controller is configured to refrain from performing read refreshes on the plurality of cells until the threshold amount of time has elapsed.

6. The storage device of claim 4, wherein the controller is configured to store a time tag associated with the block indicating when data is programmed in the block, and to determine whether the threshold amount of time has elapsed based on the time tag.

7. The storage device of claim 6, wherein the memory further includes a control block, and wherein the controller is configured to store the time tag associated with the block in the control block.

8. The storage device of claim 1, wherein the controller is configured to program a plurality of blocks including the block, and to perform the read refresh on the plurality of cells in each of the plurality of blocks after a threshold amount of time after the plurality of blocks are programmed.

9. The storage device of claim 8, wherein the controller is configured to refrain from performing read refreshes on the plurality of cells in each of the plurality of blocks until the threshold amount of time has elapsed.

10. The storage device of claim 8, wherein the controller is configured to store a time tag associated with the plurality of blocks indicating when data is programmed in the plurality of blocks, and to determine whether the threshold amount of time has elapsed based on the time tag.

11. The storage device of claim 1, wherein the controller is configured to refrain from performing read refreshes on the plurality of cells until the number of P/E cycles of the block exceeds the age threshold.

12. A storage device, comprising:
a memory including a block, the block including a plurality of cells; and
a controller coupled to the memory and configured to program the block, and to selectively apply dummy read pulses to the plurality of cells by applying periodic voltage read pulses to the plurality of cells without incurring a program/erase (P/E) cycle and without reading data in response to the periodic voltage read pulses after a threshold amount of time has elapsed since the block is programmed,
wherein the periodic voltage read pulses are only performed on the plurality of cells based on the block exceeding an age threshold.

13. The storage device of claim 12, wherein the controller is configured to refrain from applying the dummy read pulses to the plurality of cells until the threshold amount of time has elapsed.

14. The storage device of claim 12, wherein the controller is configured to store an indicator of a time when data is programmed in the block, and to determine whether the threshold amount of time has elapsed since the time when the data is programmed in the block.

15. The storage device of claim 14, wherein the memory further includes a control block, and wherein the controller is configured to store the indicator in the control block.

16. The storage device of claim 12, wherein the controller is configured to apply the dummy read pulses to the plurality of cells in response to a number of P/E cycles of the block exceeding the age threshold.

17. The storage device of claim 16, wherein the controller is configured to refrain from applying the dummy read pulses to the plurality of cells until the number of P/E cycles of the block exceeds the age threshold.

18. A storage device, comprising:
a memory including a block, the block including a plurality of cells; and
a controller coupled to the memory and configured to program data in the block, and to refrain from performing a read refresh procedure on the plurality of cells that includes selectively applying periodic voltage read pulses to the plurality of cells without incurring a program/erase (P/E) cycle and without reading data in response to the periodic voltage read pulses until a number of P/E cycles of the block exceeds an age threshold and until a threshold amount of time has elapsed since the data is programmed in the block,
wherein the periodic voltage read pulses are only performed on the plurality of cells based on the block exceeding the age threshold.

19. The storage device of claim 18, further comprising:
a die comprising a plurality of blocks including the block, wherein the controller is configured to refrain from performing read refreshes until an average number of P/E cycles of each of the plurality of blocks in the die exceeds the age threshold.

20. The storage device of claim 18, wherein the controller is configured to store a time tag associated with the block indicating when data is programmed in the block, to determine whether the threshold amount of time has elapsed based on the time tag, and to perform read refreshes in response to the determination that the threshold amount of time has elapsed based on the time tag.

* * * * *